United States Patent [19]

Stoll

[11] 4,274,049
[45] Jun. 16, 1981

[54] INTEGRATED OPTICAL R-F SPECTRUM ANALYZER

[75] Inventor: Harold M. Stoll, Palos Verdes Peninsula, Calif.

[73] Assignee: The United States of America as represented by the Secretary of the Air Force, Washington, D.C.

[21] Appl. No.: 70,454

[22] Filed: Aug. 28, 1979

[51] Int. Cl.³ .............................................. G01R 23/16
[52] U.S. Cl. ................................. 324/77 K; 350/96.13
[58] Field of Search ..................... 350/96.13, 96.14; 324/77 R, 77 K

[56] References Cited

U.S. PATENT DOCUMENTS

| | | | |
|---|---|---|---|
| 3,655,261 | 4/1972 | Chang | 350/96.13 |
| 3,942,109 | 3/1976 | Cramly | 324/77 K |
| 3,988,671 | 10/1976 | Pedinoff | 324/77 K |
| 4,047,795 | 9/1977 | Hughes | 350/96.14 |
| 4,056,304 | 11/1977 | Phillips | 350/96.14 |
| 4,084,191 | 4/1978 | Lean | 350/96.13 |
| 4,095,869 | 6/1978 | Reichelt | 350/96.14 |

*Primary Examiner*—Michael J. Tokar
*Attorney, Agent, or Firm*—Donald J. Singer; Henry S. Miller

[57] ABSTRACT

A compact lens-less spectrum analyzer where a laser impinges upon a distributed Bragg deflector via a slab-coupled optical waveguide and is bent 90 degrees. A surface acoustic wave transmitter controlled by an R-F frequency puts out a traveling strain wave which deflects the light beam according to the frequencies present; a manifold of distributed Bragg deflectors receive the deflected signal and are so arranged as to resonate at a particular frequency; the output of the resonating Bragg deflector is detected by a CCD or self-scanning diode array which produces an output indicative of the particular frequency detected.

8 Claims, 2 Drawing Figures

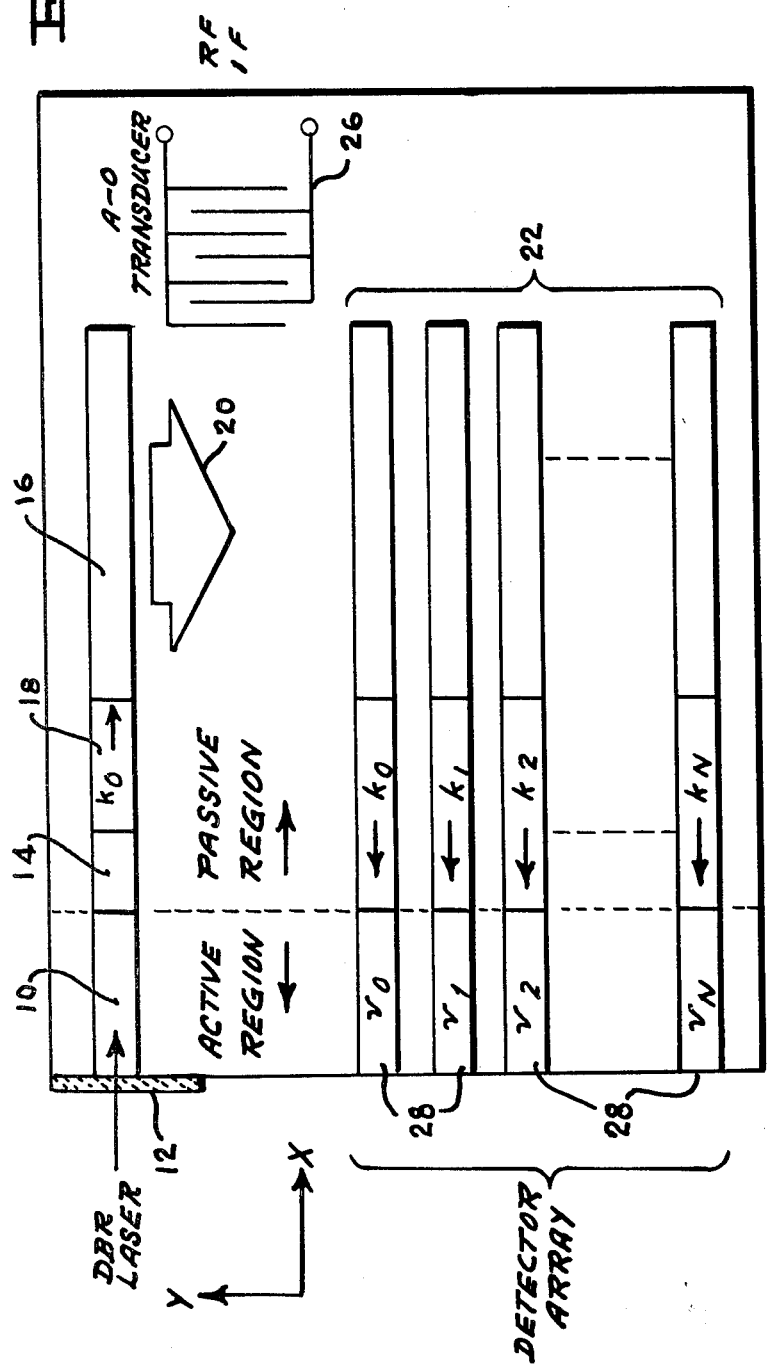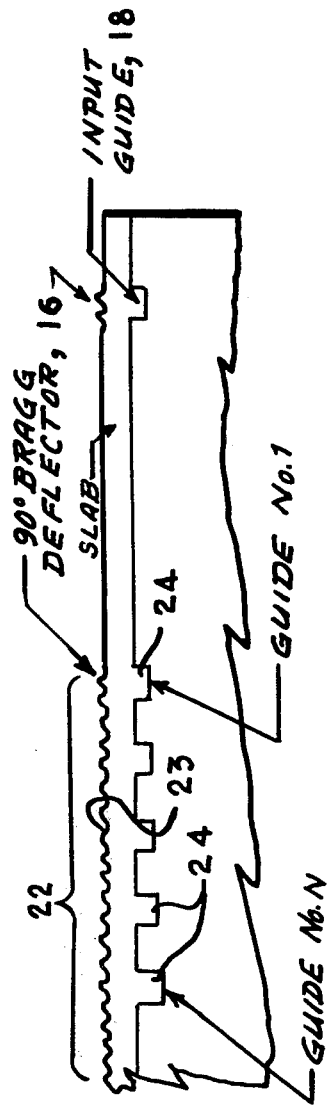

INTEGRATED OPTICAL R-F SPECTRUM ANALYZER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to spectrum analyzers and more particularly to a compact integrated optical R-F spectrum analyzer.

Although there have been a multitude of suggestions for devices that will analyze the radio frequency spectrum, there exists a need for a lightweight, compact and inexpensive device that will decompose a radio signal into its spectral component in real time. This need is particularly seen in aircraft and space craft where space and weight are of prime concern.

Purely electronic spectrum analyzers exist. They are, however, large, cumbersome and expensive. Known devices of this type do not function in real time and are not amenable to avionic or space applications.

At least one discrete component, acousto-optic spectrum analyzer is available which operates in real time. This device, however, is relatively large and heavy and not suitable for deployment in air or space vehicles. Studies are underway for integrated optical devices, but, difficulties with the fabrication of thin-film optical-waveguide lenses have forced a heterogeneous integration approach to be taken and have, by virtue of inherent low-resolution of such lenses, simultaneously increased the size and reduced the utility of the device.

The solution to the problem is the integrated optical, real-time, lens-less, R-F spectrum analyzer disclosed herein which is amenable to monolithic integration and capable of high, spectral resolution.

SUMMARY OF THE INVENTION

In accordance with a preferred embodiment an R-F spectrum analyzer is disclosed which uses a GaAs/GaAlAs material system and is implemented monolithically. The analyzer is designed to have a limiting resolution of 1 MHz (500 resolution elements over a 500 MHz bandwidth).

The device measures approximately 6.0×6.0 millimeters and contains a laser source which produces a beam of light that is deflected 90° by a Bragg deflector. A manifold of distributed Bragg deflectors, each identical in period to the first deflector, receives the deflected beam. Each deflector of the deflector manifold bears a propagation constant differing incrementally from the propagation constants of adjacent deflectors in the manifold.

Between the first deflector and the deflector manifold is a surface acoustic wave transmitter. The transmitter launches a traveling strain wave whose spatial distribution mirrors the time signature of the R-F input signal to be analyzed.

Each spatial frequency component of the strain wave acousticaly deflects a portion of the propagating light beam through a characteristic angle. The angle will correspond to the acceptance angle of a given deflector within the deflector manifold. Light resonantly coupled to one of the deflectors of the deflector manifold is detected and produces an output indicative of the frequency found.

It is therefore an object of the invention to provide a new and improved R-F spectrum analyzer.

It is another object of the invention to provide a new and improved R-F spectrum analyzer that is capable of high spectral resolution.

It is a further object of the invention to provide a new and improved R-F spectrum analyzer that is lens-less.

It is still another object of the invention to provide a new and improved spectrum analyzer that operates in real time.

It is still a further object of the invention to provide a new and improved acousto-optic spectrum analyzer that is relatively small and light in weight.

It is still another object of the invention to provide a new and improved optical, R-F spectrum analyzer that may be manufactured using monolithic integration techniques.

These and other advantages, features and objects of the invention will become more apparent from the following description taken in connection with the illustrative embodiment in the accompanying drawings.

DESCRIPTION OF THE DRAWINGS

FIG. 1 is a top view of the invention.

FIG. 2 is a cross section through the waveguide and analyzer.

DESCRIPTION OF THE PREFERRED EMBODIMENT

Referring now to FIG. 1, the integrated optical spectrum analyzer is shown from a top view. The device may be formed monolithically using gallium arsenide/gallium aluminum arsenide material.

A gallium arsenide laser is shown at 10. The laser preferred is either a double heterojunction or a large optical cavity, stripe geometry device. The cavity for the laser is formed by a 100% reflected cleave 12 and a distributed Bragg reflector (DBR) 14. Light emerging from the DBR is guided toward a distributed Bragg deflector 16 via a slab-coupled, ridge optical waveguide 18. The Bragg deflector (16) bleeds the laser beam out of the input guide (18) and directs the beam 90° from the beam of the laser. The beam emerging from deflector 16 approxmiates a plane wave 20 which is propagated in the direction shown.

The distributed Braff deflector 22 manifold comprises a series of slab-coupled waveguides 24 whose propagation constants differ incrementally within the bandwidth of surface acoustic wave transmitter 26. Deflector grating 23 which overlays wave guides 24 deflects the light and causes the appropriate waveguide within the deflector manifold 23 to resonate, depending on the R-F frequency, thereby producing an output indicative of R-F frequency (via CCD or self scanned diode array 28).

FIG. 2 relates to the analyzer cross-section of the invention. In cross section is shown the slab-coupled waveguides from the input guide (18) to the receiving guides Nos. 1 through N (24); over each of the guides is a Bragg deflector grating (16) and (22). As shown, the guides vary in depth according to the frequency at which the guide is selected to resonate. Between the input guide No. 18 and guide No. 1 is a slab section where the surface acoustic wave from transducer 26 intercepts the light and shifts the angle based upon the frequency of the wave. The surface acoustic wave is controlled by the radio frequency input to transmitter 26.

In operation the light generated by the laser source is converted via the Bragg deflector, into a near-plane wave, propagating at 90° to the longitudinal axis of the laser beam. The surface acoustic wave transmitter launches a traveling strain wave whose spatial distribution mirrors the time signature of the R-F signal to the transmitter which is to be analyzed. Each spatial frequency component of the strain wave acoustically deflects a portion of the downward-propagating light beam through a characteristic angle. Each characteristic angle, within the bandwidth of the surface acoustic wave transmitter corresponds to the acceptance angle of a given waveguide within the lower N-wave guide manifold (22). Light resonantly coupled to one of the lower waveguides is detected by either a CCD or a self-scanned, diode array. The output from the detector then is an indication of the frequency of the R-F signal.

Although the invention has been described with reference to a particular embodiment, it will be understood to those skilled in the art that the invention is capable of a variety of alternative embodiments within the spirit and scope of the appended claims.

I claim:

1. An integrated optical, real time R-F spectrum analyzer comprising a substrate; an active material overlying the substrate; a lasing medium located in the active material; waveguide means associated with the lasing medium for directing light generated from said lasing medium; a first distributed Bragg deflector means overlying the waveguide for directing light in the waveguide in a direction transverse to the longitudinal axis of the waveguide through said active material; a second distributed Bragg deflector matched to said first Bragg deflector for receiving light therefrom; a plurality of waveguides of preselected resonances in said substrate adjacent said second distributed Bragg deflector manifold adapted to resonate at preselected light angles; detectors connected to the waveguides of said deflector manifold producing an output signal when a waveguide resonates, and a surface acoustic wave transmitter driven by a radio frequency and transmitting a strain wave whereby light transmitted from said first distributed Bragg deflector to said second distributed Bragg deflector manifold is altered through an angle characteristic of the frequency of the input to the transmitter and one of the preselected resonances in the said plurality of waveguides.

2. An integrated optical, real time R-F spectrum analyzer according to claim 1 wherein the lasing means is a distributed Bragg reflector.

3. An integrated optical, real time R-F spectrum analyzer according to claim 2 wherein the substrate is gallium arsenide.

4. An integrated optical, real time R-F spectrum analyzer according to claim 3 wherein the active material is gallium aluminum arsenide.

5. An integrated optical, real time R-F spectrum analyzer according to claim 4 wherein the light leaving the first distributed Bragg deflector is a near plane one.

6. An integrated optical, real time R-F spectrum analyzer according to claim 5 wherein the said waveguides are ridge waveguides of different propagation constants.

7. An integrated optical, real time R-F spectrum analyzer according to claim 6 wherein said detectors are charge coupled devices.

8. An integrated optical, real time R-F spectrum analyzer according to claim 6 wherein said detectors are formed of a self-scanned diode array.

* * * * *